(12) United States Patent
Minami (10) Patent No.: US 7,790,335 B2
(45) Date of Patent: Sep. 7, 2010

(54) PHOTOMASK AND MANUFACTURING METHOD OF SEMICONDUCTOR DEVICE

(75) Inventor: Takayoshi Minami, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 886 days.

(21) Appl. No.: 11/084,017

(22) Filed: Mar. 21, 2005

(65) Prior Publication Data

US 2005/0164129 A1    Jul. 28, 2005

Related U.S. Application Data

(63) Continuation of application No. PCT/JP03/02211, filed on Feb. 27, 2003.

(51) Int. Cl.
*G03F 9/00* (2006.01)
*G03F 7/26* (2006.01)

(52) U.S. Cl. .......................... 430/5; 430/311; 430/394; 430/396; 430/312

(58) Field of Classification Search .............. 430/5, 430/311, 394, 322
See application file for complete search history.

(56) References Cited

U.S. PATENT DOCUMENTS

| | | | |
|---|---|---|---|
| 5,424,154 A * | 6/1995 | Borodovsky | .................... 430/5 |
| 5,573,890 A | 11/1996 | Spence | |
| 5,858,580 A | 1/1999 | Wang et al. | |
| 6,074,787 A | 6/2000 | Takeuchi | |
| 6,660,462 B1 * | 12/2003 | Fukuda | .................... 430/394 |
| 6,861,178 B2 | 3/2005 | Kikuchi | |

FOREIGN PATENT DOCUMENTS

| | | |
|---|---|---|
| JP | 5-72717 | 3/1993 |
| JP | 5-204131 | 8/1993 |
| JP | 6-236836 | 8/1994 |
| JP | 10-326006 A | 12/1998 |
| JP | 11-7120 A | 1/1999 |
| JP | 11-15129 | 1/1999 |

(Continued)

OTHER PUBLICATIONS

Japanese Office Action dated Apr. 7, 2009 in corresponding Japanese Patent Application 2004-568745.

(Continued)

*Primary Examiner*—Kathleen Duda
*Assistant Examiner*—Caleen O Sullivan
(74) *Attorney, Agent, or Firm*—Westerman, Hattori, Daniels & Adrian, LLP (57) ABSTRACT

A double exposure process is performed using a halftone phase shift mask (11) including gate patterns (1), assist patterns (2*a*) and (2*b*) with different resoluble line widths, and an assist pattern (2*c*) with a line width equal to or smaller than a resolution limit which are respectively inserted into portions in each of which a distance between the gate patterns (1) is large, and a Levenson phase shift mask (11) including shifter patterns (3) corresponding to the gate patterns (1) of the photomask 11. On this occasion, the assist patterns (2*a*), (2*b*), and (2*c*) are erased and only the gate patterns (1) are transferred. Consequently, when patterns are transferred by the double exposure process, a common depth of focus of the patterns is improved and highly uniform line widths are realized, which makes it possible to manufacture a highly reliable semiconductor device.

14 Claims, 7 Drawing Sheets

FIRST MASK

FOREIGN PATENT DOCUMENTS

| | | |
|---|---|---|
| JP | 11-214280 A | 8/1999 |
| JP | 2000-112114 | 4/2000 |
| JP | 2001-42545 A | 2/2001 |
| JP | 2001-44092 | 2/2001 |
| JP | 2001-100390 A | 4/2001 |
| JP | 2002-351047 A | 12/2002 |

OTHER PUBLICATIONS

Japanese Office Action dated Jan. 12, 2010, issued in corresponding patent No. JP-2004-568745. (Partial Translation).

* cited by examiner

FIG. 1A

FIRST MASK

FIG. 1B

SECOND MASK

FIG. 1C

DOUBLE
EXPOSURE
IMAGE

FIRST MASK

FIG. 4B

SECOND MASK

FIG. 4C

DOUBLE EXPOSURE IMAGE

FIG. 5A

FIRST MASK

FIG. 5B

SECOND MASK

FIG. 5C

DOUBLE EXPOSURE IMAGE

FIG. 6

LINE WIDTH ① AND LINE WIDTH ② ARE DIFFERENT
BECAUSE OF DIFFERENT GATE PATTERN PITCHES

FIG. 7A

FIRST MASK

FIG. 7B

SECOND MASK

FIG. 7C

DOUBLE EXPOSURE IMAGE

PHOTOMASK AND MANUFACTURING METHOD OF SEMICONDUCTOR DEVICE

This application is a continuation of international application PCT/JP03/02211 filed on Feb. 27, 2003.

TECHNICAL FIELD

The present invention relates to a photomask and a manufacturing method of a semiconductor device, and particularly it is suitable for application to a case where an extremely fine-sized gate is formed.

BACKGROUND ART

In recent years, with the scaling down of a device, it becomes difficult to form a fine pattern and a fine pitch, and hence a double exposure process in which two photomasks are used in one layer is introduced to form the fine pattern. At present, in the double exposure process, a phase edge technique attracts the greatest attention. This technique is mainly used for gate formation, and in a region where a fine gate pattern is formed, a Levenson phase shift mask is used in addition to a photomask (binary mask or halftone phase shift mask) to form a normal pattern. The Levenson phase shift mask has the effect of, by arranging 0/π phase shifters on both sides of a pattern which becomes a gate electrode, inverting the amplitude of light in this region to raise a contrast. Consequently, it is possible to stably form even a pattern of 100 nm or less. Representatives of documents regarding this technique are U.S. Pat. No. 5,573,890 in which its principle is described and U.S. Pat. No. 5,858,580 in which a method of arranging shifters is described.

Figure 7A:
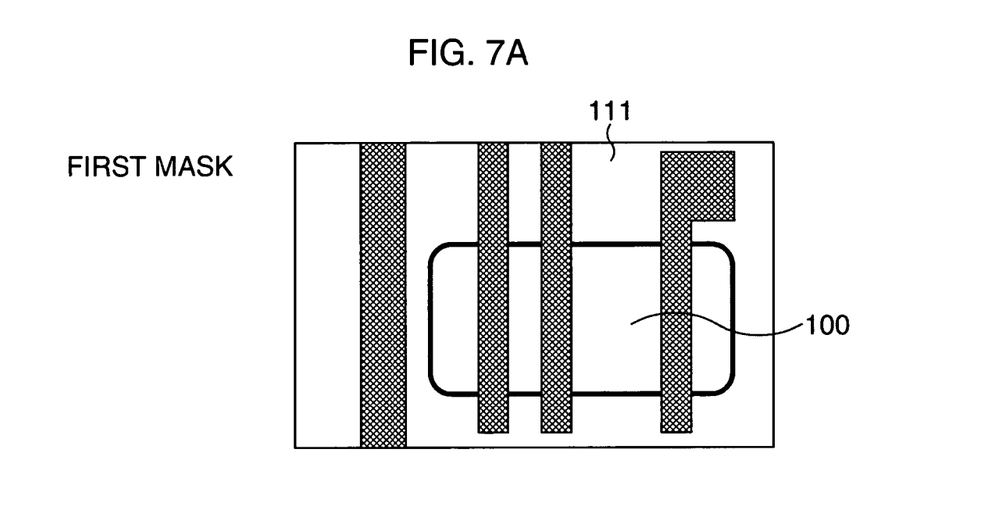
FIG. 7A to FIG. 7C are schematic plan views for explaining a case where gate patterns are formed by a conventional phase edge technique.
Figure 7B:
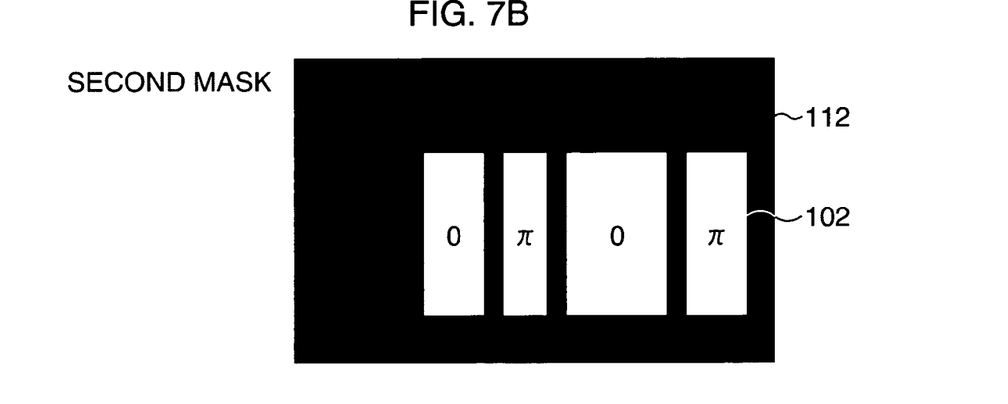
Figure 7C:
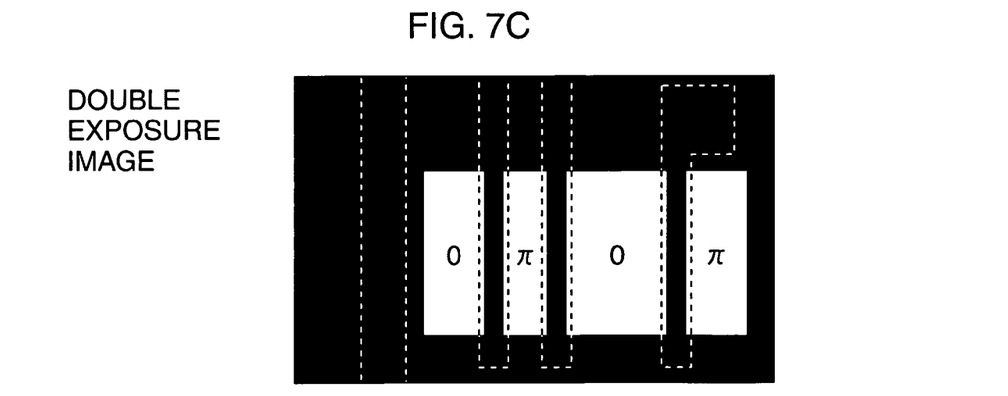

FIG. 7A to FIG. 7C are schematic plan views for explaining a case where gate patterns are formed by the phase edge technique.

A first photomask 111 is a first mask (binary mask or halftone phase shift mask) to form normal gate patterns as shown in FIG. 7A. This photomask 111 has gate patterns 101 to form gates, and the gate patterns 101 are exposed/transferred onto a photoresist on a substrate. Incidentally, for convenience, a portion of the gate, which is located on an active region 100 when the gate pattern 101 is transferred and the gate is formed, is called a gate electrode, and a portion thereof which is located on the other region (including an element isolation structure) is called a gate wiring.

A second photomask 112 is a Levenson phase shift mask (second mask) as shown in FIG. 7B. This photomask 112 has shifter patterns 102 corresponding to the gate patterns 101 of the photomask 111.

FIG. 7C shows an image obtained by overlapping these two photomasks 111 and 112. By aligning these two photomasks as shown and exposing the respective photomasks continuously (it makes no difference which photomask is exposed earlier), the gate patterns can be transferred to the photoresist on the substrate. It turns out that by using the Levenson phase shift mask as the photomask 112, the line width of the gate pattern only in a portion subjected to the double exposure process becomes very fine.

However, the phase edge technique of forming such fine patterns has a problem. The problem is a depth of focus. The Levenson phase shift mask realizes a high contrast as explained earlier, whereby a depth of focus sufficient to manufacture a device can be obtained. On the other hand, concerning the mask (binary mask/halftone phase shift mask) to form normal patterns, the patterns are formed in the vicinity of a resolution limit, whereby a sufficient depth of focus cannot be obtained in the gate patterns or the like which are not formed by the double exposure process. Moreover, also in gate electrode patterns formed by the double exposure process, it is similarly difficult to obtain a sufficient depth of focus when the photomask to form the normal patterns is exposed. Therefore, although the gate electrodes require highly uniform line widths in terms of device characteristics, dimension uniformity is degraded by variations in focus value when the mask to form the normal patterns is exposed.

SUMMARY OF THE INVENTION

The present invention is made in view of the aforementioned problem, and its object is to provide a photomask and a manufacturing method of a semiconductor device which make it possible to manufacture a highly reliable semiconductor device by improving a common depth of focus of patterns to thereby realize highly uniform line widths when the patterns are transferred by a double exposure process.

A manufacturing method of semiconductor device of the present invention is a manufacturing method of a semiconductor device in which pattern transfer is performed by a double exposure process and whose principal object is to transfer a gate pattern, comprising the steps of: performing exposure with a first mask including a first pattern and a second pattern; and performing exposure with a second mask including a third pattern, wherein by the double exposure process, the second pattern is erased by the third pattern and only the first pattern is transferred.

Here, the second pattern entirely has a width equal to or larger than a resolution limit, or the second pattern includes a portion having a width equal to or larger than a resolution limit.

Moreover, the second pattern may be formed to have a portion having a width equal to or smaller than a resolution limit.

A photomask of the present invention is a photomask to perform pattern transfer by a double exposure process, comprising: a first mask including a first pattern and a second pattern; and a second mask including a third pattern, wherein by the double exposure process, the second pattern is erased by the third pattern and only the first pattern is transferred.

DETAILED DESCRIPTION OF THE PREFERRED EMBODIMENTS

Basic Gist of the Present Invention

To solve the aforementioned problem accompanying a phase edge technique, that is, a problem that when gate patterns are formed by a double exposure process, a common depth of focus of the patterns becomes insufficient, which causes a degradation in dimension uniformity, the present inventor comes up with the idea of combining an improved idea of a technique of forming an assist pattern which will be described later with the phase edge technique.

Now, an explanation of the technique of forming an assist pattern (scattering bar) will be given.

If even patterns which have the same line width differ in distance between the patterns (space width) on a photomask, in some cases, their respective dimensions becomes different when the patterns are transferred onto a substrate, and depths of focus differ from one pattern to another. When the respective dimensions (line widths) are different, the dimensions can be made equal to some extent by performing an optical proximity correction (OPC) process on the photomask. On the other hand, when depths of focus are different, fine patterns each having a width equal to or smaller than a resolution limit are inserted between patterns, leaving a given space, for example, in a portion where the depth of focus degrades (a pattern in which the space width is somewhat wide). These patterns are not transferred since their widths are equal to or smaller than the resolution limit. As a result, variations in the distance between patterns (space width) can be reduced, and moreover a lighting condition (for example, oblique incidence illumination) under which the depth of focus increases by repeated patterns or the like is used, resulting in a comprehensive improvement in the depth of focus. Such a fine pattern equal to or smaller than the resolution limit is called an assist pattern (scattering bar), and it is one of typical methods for improving the depth of focus.

In this forming technique, the assist pattern is required not to be transferred to the last from its property, and hence it is essential that the assist pattern is formed so as to be "a fine pattern having a width equal to or smaller than the resolution limit" as described above, but the formation of this very fine pattern on a mask itself is difficult, whereby the present situation has not reached the extent that a sufficient effect is produced while such a limitation is imposed.

In view of the fact that a principal factor of a reduction in the depth of focus is a first mask (binary mask/halftone phase shift mask) on which normal patterns are formed in a double exposure process, the present inventor inserts and interpolates an assist pattern into each of portions of the first mask where a space between patterns is large to make the distances between patterns uniform. On this occasion, the fact that the double exposure process is a technique of forming a so-called composite pattern using two kinds of photomasks is utilized. Namely, as described above, the conventional technique of forming an assist pattern is based on the premise that, first of all, the assist pattern is formed so as to be the fine pattern having a width equal to or smaller than the resolution limit, but since the assist pattern is only required to be erased by the aforementioned composition and not to be transferred, the assist pattern can be formed relatively easily without being bound by the constraint that it has a width equal to or smaller than the resolution limit.

Moreover, the assist pattern having a line width equal to or smaller than the resolution limit is a fine pattern, and hence cannot be accurately fabricated and inspected when the photomask is formed, whereby it is difficult to change its dimension according to the distance between patterns (space width), but in the case of the assist pattern having a resoluble line width, it is relatively easy to change its dimension according to a space width, which makes it possible to provide the assist pattern with an optimum line width corresponding to line widths of and a space width between patterns to be transferred.

As described above, in the present invention, by performing double exposure using a first mask on which in addition to patterns to be transferred, assist patterns are formed without being bound by the constraint that their line widths are equal to or smaller than the resolution limit and a second mask such as a Levenson phase sift mask, the assist patterns are erased, and only desired patterns represented by gate patterns are transferred. As a result, the common depth of focus can be easily and surely improved. Moreover, by optimizing the assist patterns corresponding to line widths of and spaces width between the patterns to be transferred, it becomes possible to further improve the common depth of focus and realize highly uniform line widths of the patterns to be transferred.

SPECIFIC EMBODIMENTS OF THE PRESENT INVENTION

First Embodiment

Figure 1A:
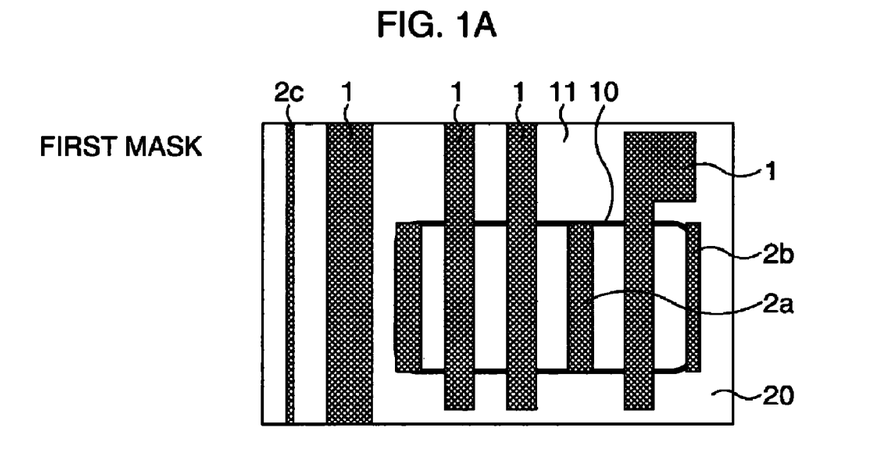
FIG. 1A to FIG. 1C are schematic plan views for explaining a manufacturing method of a semiconductor device including a gate according to a first embodiment.
Figure 1B:
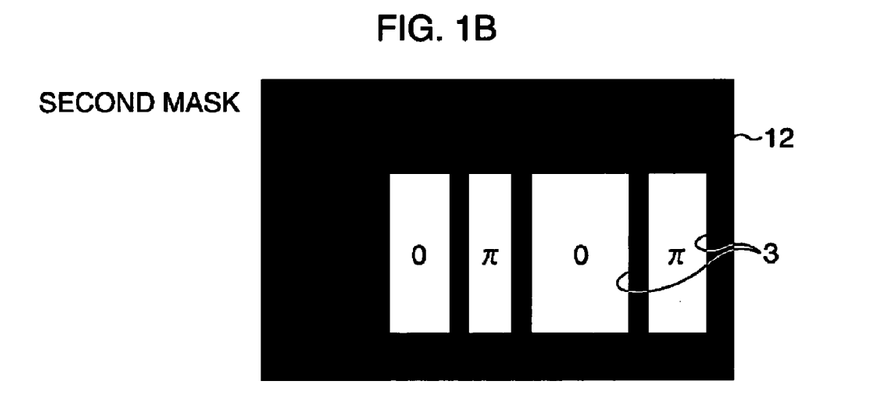
Figure 1C:
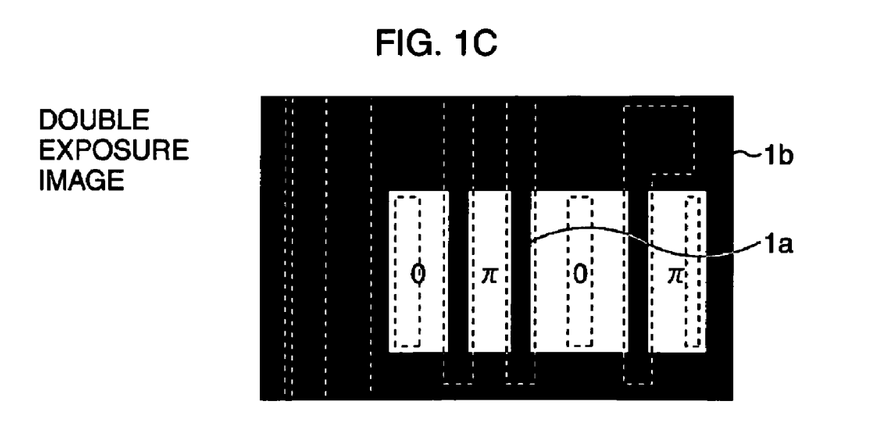

FIG. 1A to FIG. 1C are schematic plan views for explaining a manufacturing method of a semiconductor device including a gate according to the first embodiment. Here, an explanation will be given with a particular emphasis on a process of forming gate patterns by a phase edge technique.

A first photomask 11 is a halftone phase shift mask (for example, a transmittance of 6%) for an ArF excimer laser as shown in FIG. 1A. This photomask 11 includes gate patterns 1 to form gates and assist patterns 2a, 2b, and 2c to be inserted into portions in each of which a distance between the gate patterns 1 is large. Here, the assist pattern 2a has a shape corresponding to only a position of an active region 10 to be exposed, the assist pattern 2b is formed to have a resoluble line width, which is different from the assist pattern 2a, and these assist patterns 2a and 2b have each a line width optimized according to the line widths of and space width between the respective gate patterns 1 of the photomask 11. Moreover, the assist pattern 2c is formed to have a line width equal to or smaller than a resolution limit. Since these assist patterns are finally erased, they can be selected optimally according to their respective pattern line widths and spaced widths.

A second photomask 12 is a Levenson phase shift mask for the ArF excimer laser as shown in FIG. 1B. The photomask 12 includes shifter patterns 3 corresponding to the gate patterns 1 of the photomask 11.

The gate patterns are formed by using these two photomasks 11 and 12.

First, a silicon oxynitride film (not shown) with a film thickness of approximately 1 nm which becomes a gate oxide film is deposited on a wafer substrate 20 in which a element region (active region) is formed, and subsequently, a polycrystalline silicon film (not shown) with a film thickness of approximately 100 nm is deposited. An organic antireflection film (not shown) with a film thickness of approximately 80 nm is applied thereonto, and additionally an ArF positive resist (not shown) which is a photosensitive material with a film thickness of approximately 250 nm to approximately 300 nm is applied thereonto.

The already described two photomasks 11 and 12 are continuously exposed onto the wafer substrate 20 in the aforementioned state by a reduction projection exposure system using an ArF excimer laser as a light source (it makes no difference which photomask is exposed earlier). The exposure conditions of the photomask 11 being the halftone phase shift mask are a numerical aperture (NA) of 0.75, ⅔ annular illumination (σ value: $0.567/0.85$), and an exposure between approximately 150 J/cm² and approximately 200 J/cm². On the other hand, the exposure conditions of the photomask 12 being the Levenson phase shift mask are a numerical aperture (NA) of 0.75, a σ value of 0.30, and an exposure between approximately 100 J/cm² and approximately 150 J/cm².

FIG. 1C shows an image obtained by overlapping these two photomasks 11 and 12.

As shown therein, the assist pattern 2a of the photomask 11 overlaps with the shifter pattern 3 of the photomask 12 in such a manner as to be contained therein, and therefore it is not transferred although it has the resoluble line width. The assist pattern 2c does not overlap with the shifter pattern 3, but it is not transferred since it has the line width equal to or smaller than the resolution limit. On the other hand, as for the gate pattern 1 of the photomask 11, its gate electrode pattern 1a overlaps with a narrow-width portion between the shifter patterns 3 of the photomask 12, whereby the gate electrode pattern 1a is transferred narrowly, and the gate wiring pattern 1b is transferred more widely than the gate electrode pattern 1a.

Figure 2:
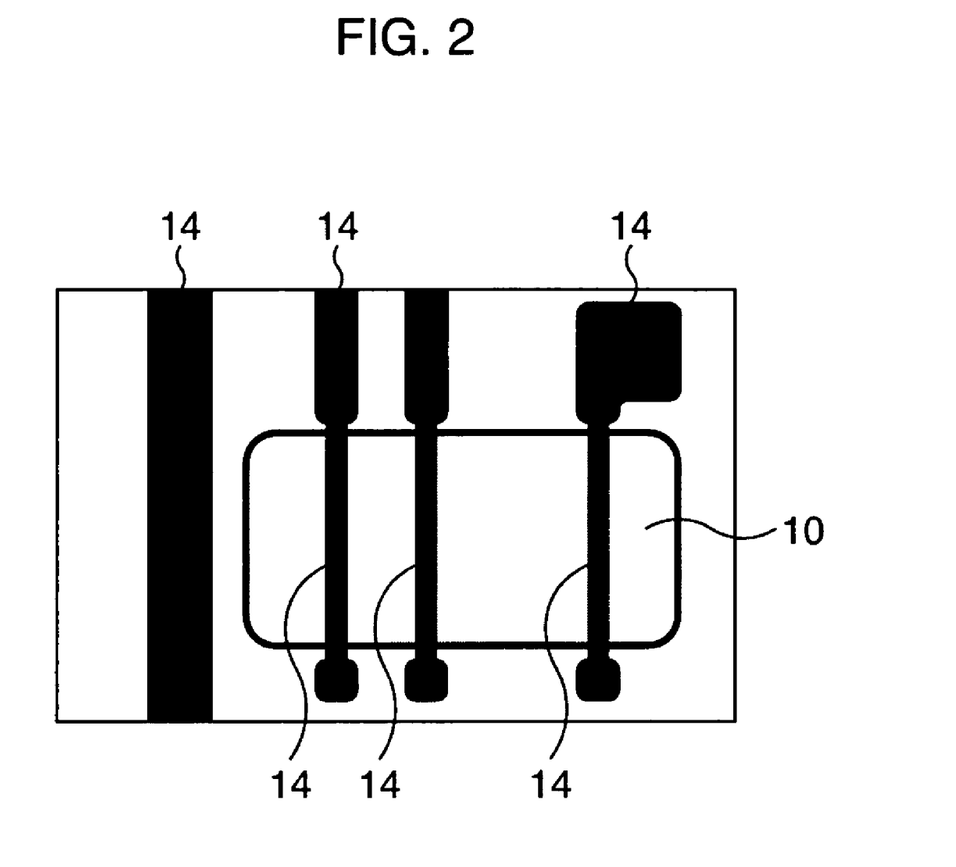
FIG. 2 is a schematic plan view showing a state of resist patterns obtained by transferring gate patterns according to the first embodiment.

Thereafter, a post-exposure bake (PEB) and a development process are performed to form resist patterns. FIG. 2 shows a state described just above. As shown, resist patterns 14 reflect the photomasks 11 and 12 and each is formed to have a shape having a narrow gate electrode pattern portion.

Then, with this resist patterns 14 as a mask, the antireflection film, the polycrystalline silicon film, and the gate oxide film are etched to form gates (not shown).

As described above, according to the phase edge technique of this embodiment, it becomes possible to stably form gates each having a gate electrode with a line width of approximately 60 nm. As described above, the common depth of focus of the gate patterns is improved by the assist patterns 2a and 2b, which leads to an improvement in dimension uniformity within the surface of a wafer (Usually, when the depth of focus is insufficient, dimension variation increases due to the influence of steps on the wafer substrate).

The details of an effect produced by the present invention will be explained by means of FIG. 3A and FIG. 3B.

Figure 3A:
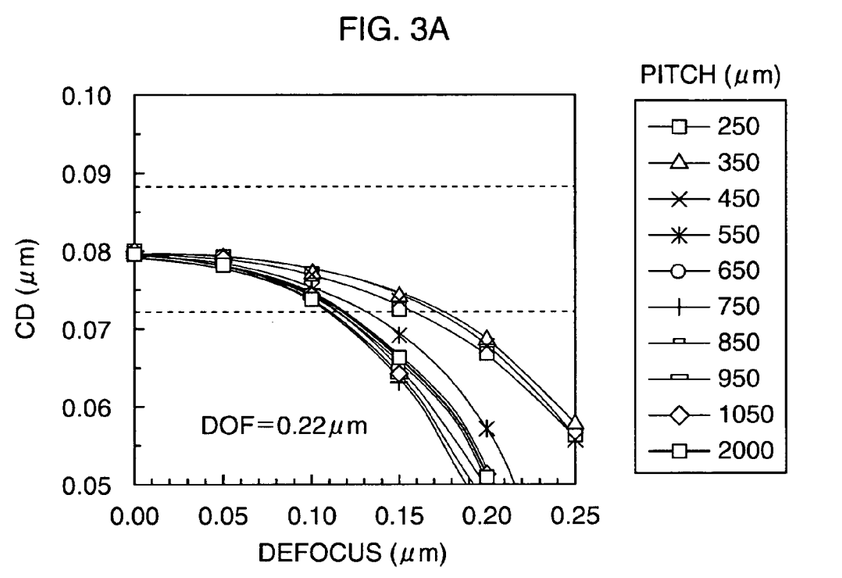
FIG. 3A and FIG. 3B are characteristic charts for explaining the details of an effect produced by the invention.
Figure 3B:
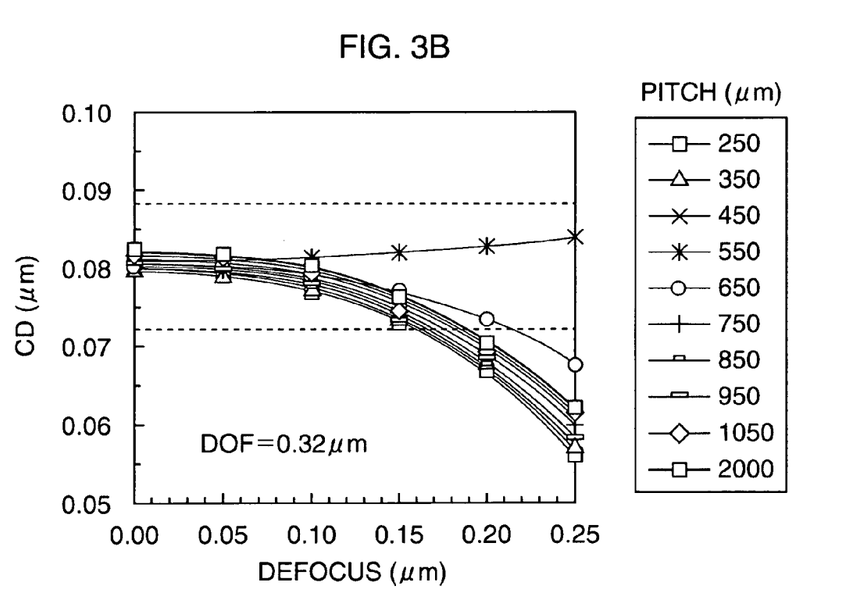

FIG. 3A shows the depth of focus when no assist pattern is formed as a comparative example, and FIG. 3B shows the depth of focus when the assist patterns according to the present invention are formed. Both are described on a case where the pattern pitch is between 250 nm and 2000 nm. The assist patterns inserted here are each a line pattern with a line width of 80 nm and inserted into both sides of gate patterns with a 550 nm or more pitch, leaving a space of 60 nm from the gate patterns. When a comparison is made with the line width of the resist pattern as 80 nm, it is found that the common focus of depth increases from 0.22 μm (FIG. 3A) to 0.32 μm (FIG. 3B) on both sides, and that the effect thereof is approximately a little less than one and half times.

It turns out that in FIG. 3A, gate patterns with a larger pitch have a smaller depth of focus, whereby the common depth of focus degrades, and on the other hand, in FIG. 3B, by inserting the assist patterns, they have a larger depth of focus than gate patterns with a smaller pitch into which no assist pattern can be inserted.

From the above, it can be confirmed that the present invention is effective in making gate line widths very uniform.

Second Embodiment

Figure 4A:
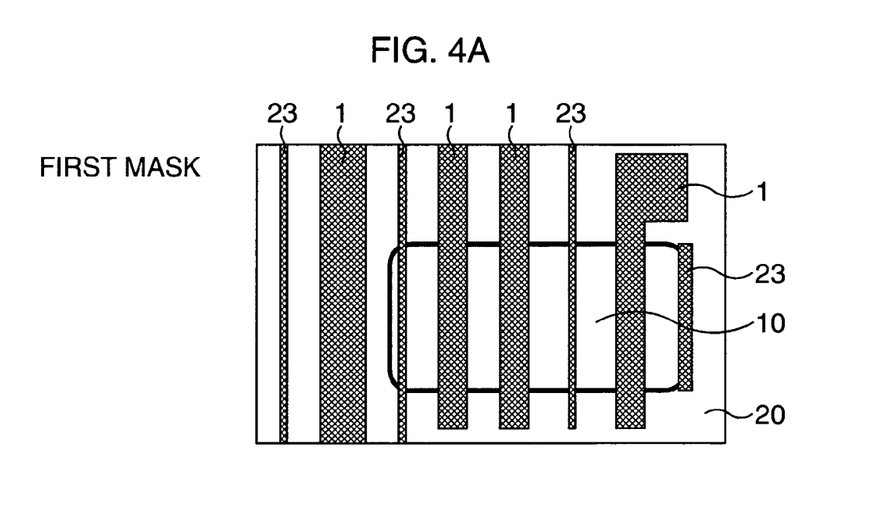
FIG. 4A to FIG. 4C are schematic plan views for explaining a manufacturing method of a semiconductor device including a gate according to a second embodiment.
Figure 4B:
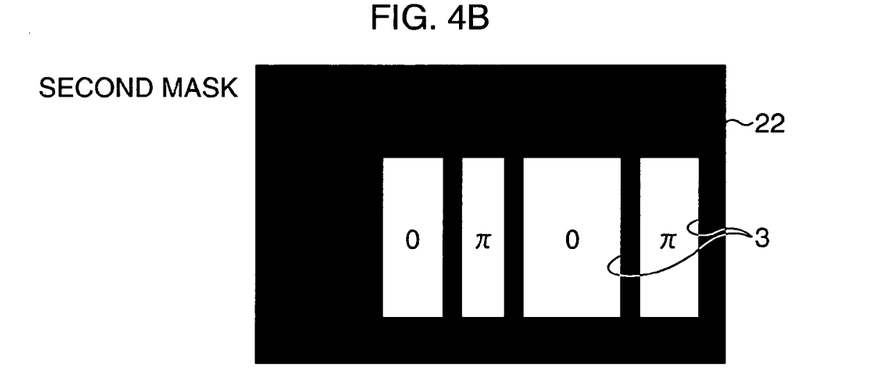
Figure 4C:
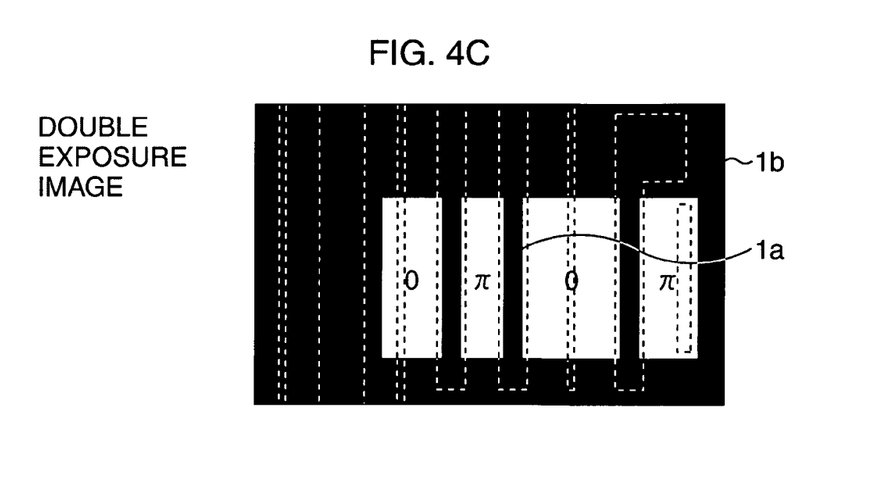

FIG. 4A to FIG. 4C are schematic plan views for explaining a manufacturing method of a semiconductor device including a gate according to the second embodiment. Here, an explanation will be given with a particular emphasis on a process of forming gate patterns by the phase edge technique.

A first photomask 21 is a halftone phase shift mask (for example, a transmittance of 6%) for an ArF excimer laser as shown in FIG. 4A. This photomask 21 includes gate patterns 1 to form gates and assist patterns 23 each having a line width equal to or smaller than a resolution limit which are to be inserted into portions in each of which a distance between the gate patterns 1 is large. Here, all the assist patterns 23 have the same width, for example, from approximately 50 nm to approximately 60 nm on the wafer substrate 20.

A second photomask 22 is a Levenson phase shift mask for the ArF excimer laser as shown in FIG. 4B. The photomask 22 includes shifter patterns 3 corresponding to the gate patterns 1 of the photomask 21.

The gate patterns are formed by using these two photomasks 21 and 22.

Here, using the wafer substrate 20 on which the silicon oxynitride film, the polycrystalline silicon film, the antireflection film, the ArF positive resist being the photosensitive material are formed in the same manner as in the first embodiment, a double exposure process is performed under the same conditions. Under these exposure conditions, if the line width of the assist pattern 23 is approximately 50 nm to approximately 60 nm on the wafer substrate 20, no pattern is formed on the wafer substrate 20. Incidentally, the actual wiring minimum line width of the photomask 21 at this time is 100 nm.

FIG. 4C shows an image obtained by overlapping these two photomasks 21 and 22.

As shown therein, the assist patterns 23 of the photomask 21 are not transferred since they have the line width equal to or smaller than the resolution limit. On the other hand, as for the gate pattern 1 of the photomask 21, its gate electrode pattern 1a overlaps with a narrow-width portion between the shifter patterns 3 of the photomask 22, whereby the gate electrode pattern 1a is transferred narrowly, and the gate wiring pattern 1b is transferred more widely than the gate electrode pattern 1a.

Thereafter, a post-exposure bake (PEB) and a development process are performed to form resist patterns. Then, with these resist patterns as a mask, the antireflection film, the polycrystalline silicon film, and the gate oxide film are etched to form gates (not shown). As described above, according to the phase edge technique of this embodiment, it becomes possible to stably form gates each having a gate electrode with a line width of approximately 60 nm. As described above, the depths of focus of the gate patterns are improved by the assist patterns 23, which leads to an improvement in dimension uniformity within the surface of a wafer (Usually, when the depth of focus is insufficient, dimension variation increases due to the influence of steps on the wafer substrate).

Third Embodiment

Figure 5A:
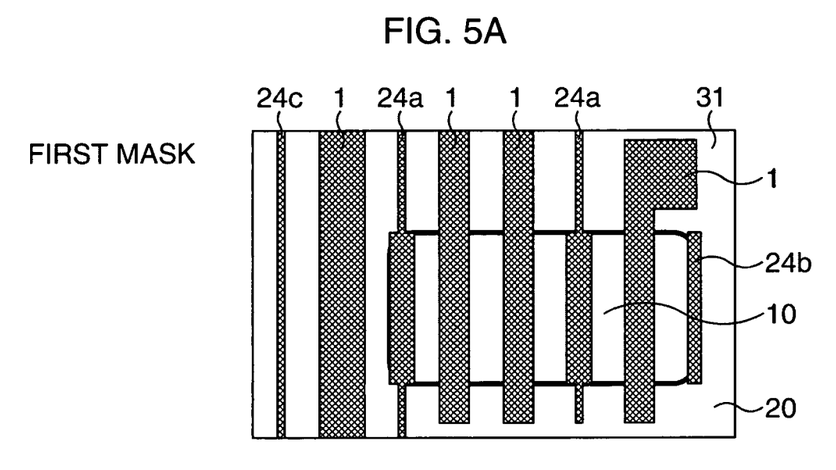
FIG. 5A to FIG. 5C are schematic plan views for explaining a manufacturing method of a semiconductor device including a gate according to a third embodiment.
Figure 5B:
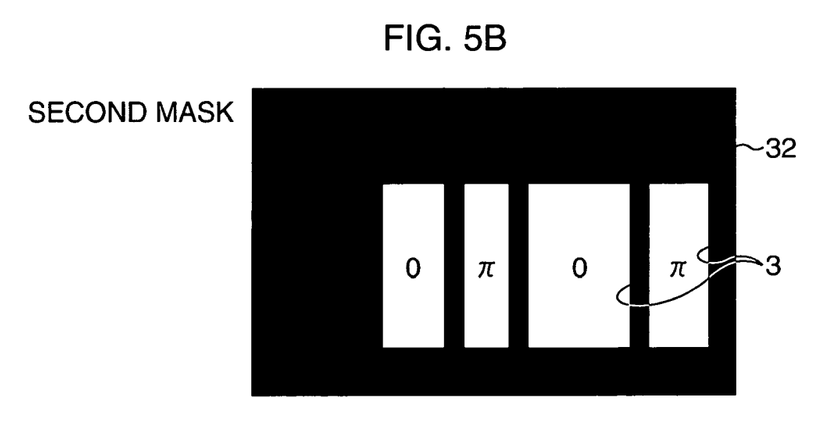
Figure 5C:
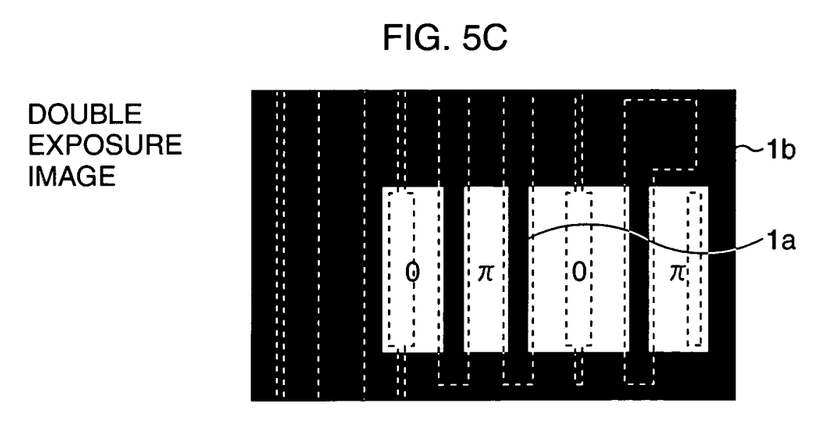

FIG. 5A to FIG. 5C are schematic plan views for explaining a manufacturing method of a semiconductor device including a gate according to the third embodiment. Here, an explanation will be given with a particular emphasis on a process of forming gate patterns by the phase edge technique.

Figure 6:
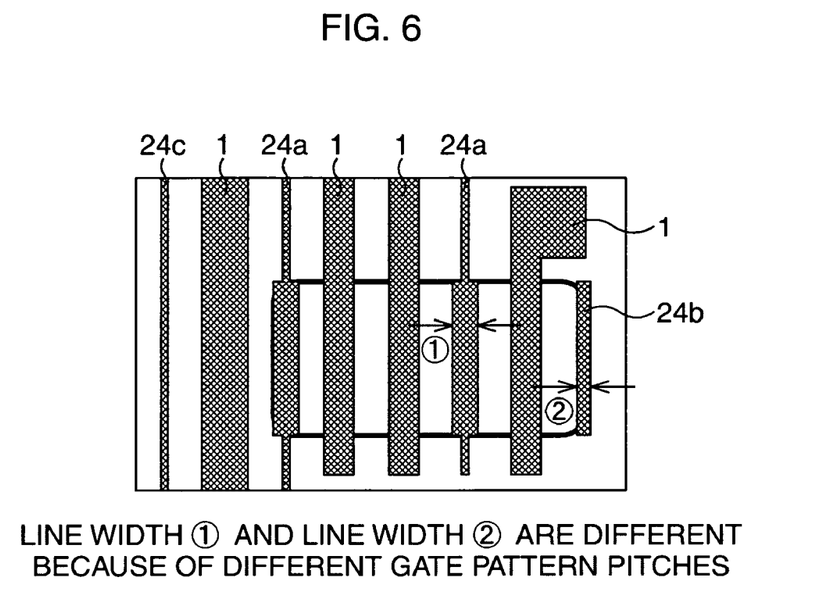
FIG. 6 is a schematic plan view showing a comparison of a line width of a wide-width portion of an assist pattern in the third embodiment.

A first photomask 31 is a halftone phase shift mask (for example, a transmittance of 6%) for an ArF excimer laser as shown in FIG. 5A. This photomask 31 includes gate patterns 1 to form gates and assist patterns 24a, 24b, and 24c to be inserted into portions in each of which a distance between the gate patterns 1 is large. Here, a narrow-width portion of the assist pattern 24a is formed to have a line width equal to or smaller than a resolution limit, a wide-width portion thereof is formed to have a resoluble line width, the assist pattern 24b is formed to have a resoluble line width which is different from the assist pattern 24a, and these assist patterns 24a and 24b respectively have line widths optimized according to the line widths of and space widths between the gate patterns 1 of the photomask 31 (FIG. 6 shows the line width of the wide-width portion of the assist pattern 24a as ① and the line width of the assist pattern 24b as ②). Moreover, the assist pattern 24c is formed to have a line width equal to or smaller than the resolution limit. Since these assist patterns are finally erased, they can be selected optimally according to respective pattern line widths and space widths.

A second photomask 32 is a Levenson phase shift mask for the ArF excimer laser as shown in FIG. 5B. The photomask 32 includes shifter patterns 3 corresponding to the gate patterns 1 of the photomask 31.

The gate patterns are formed by using these two photomasks 31 and 32.

Here, using the wafer substrate 20 on which the silicon oxynitride film, the polycrystalline silicon film, the antireflection film, the ArF positive resist being the photosensitive material are formed in the same manner as in the first embodiment, a double exposure process is performed under the same conditions.

FIG. 5C shows an image obtained by overlapping these two photomasks 31 and 32.

As shown therein, since the wide-width portion of the assist pattern 24a of the photomask 31 and the assist pattern 24b overlap with the shifter patterns 3 in such a manner as to be contained therein, and therefore they are not transferred although they have the resoluble line widths. Moreover, the narrow-width portion of the assist pattern 24a and the assist pattern 24c do not overlap with the shifter patterns 3, but they are not transferred since they have the line widths equal to or smaller than the resolution limit. On the other hand, as for the gate pattern 1 of the photomask 11, its gate electrode pattern 1a overlaps with a narrow-width portion between the shifter patterns 3 of the photomask 32, whereby the gate electrode pattern 1a is transferred narrowly, and the gate wiring pattern 1b is transferred more widely than the gate electrode pattern 1a.

Thereafter, a post-exposure bake (PEB) and a development process are performed to form resist patterns. Then, with these resist patterns as a mask, the antireflection film, the polycrystalline silicon film, and the gate oxide film are etched to form gates (not shown).

As described above, according to the phase edge technique of this embodiment, it becomes possible to stably form gates each having a gate electrode with a line width of approximately 60 nm. As described above, the depths of focus of the gate patterns between which the distance is large are improved by the assist patterns 24a, 24b, and 24c, which leads to an improvement in dimension uniformity within the surface of a wafer (Usually, when the depth of focus is insufficient, dimension variation increases due to the influence of steps on the wafer substrate).

Industrial Applicability

According to the present invention, when patterns are transferred by a double exposure process, by improving a common depth of focus of the patterns to realize highly uniform line widths, a highly reliable semiconductor device can be manufactured.

What is claimed is:

1. A manufacturing method of semiconductor device in which pattern transfer is performed by a double exposure process, said manufacturing method comprising the steps of:

performing exposure with a first mask including a first pattern and a second pattern; and performing exposure with a second mask including a third pattern, said second pattern includes a first portion and a second portion in which when the double exposure process is performed, said first portion, which is overlapping with the third pattern, has the width equal to or larger than the resolution limit, and said second portion of the second pattern, which is not overlapping with the third pattern, has the width equal to or smaller than the resolution limit;

said first pattern includes a third portion and a fourth portion in which when the double exposure process is performed, said third portion, which is overlapping with the third pattern, has the width equal to or larger than the resolution limit, and said fourth portion, which is not overlapping with the third pattern, has the width equal to or larger than the resolution limit; and by the double exposure process, said first portion of the second pattern is erased by the third pattern and only the first pattern is transferred.

2. The manufacturing method of the semiconductor device according to claim 1, wherein the first pattern is a gate pattern to form a gate.

3. The manufacturing method of the semiconductor device according to claim 1, wherein the first pattern is a gate pattern to form a gate, and the portion having the width equal to or larger than the resolution limit is a gate electrode pattern.

4. The manufacturing method of the semiconductor device according to claim 1, wherein the first pattern is a gate pattern to form a gate, and the portion having the width equal to or smaller than the resolution limit is a gate wiring pattern.

5. The manufacturing method of the semiconductor device according to claim 1, wherein in the second mask, the third pattern is formed to correspond only to the first pattern.

6. The manufacturing method of the semiconductor device according to claim 1, wherein the width of the second pattern is adjusted so that the second pattern can be removed with the exposure of the second mask.

7. The manufacturing method of the semiconductor device according to claim 1, wherein the second mask is a phase shift mask.

8. A photomask to perform pattern transfer by a double exposure process, comprising:

a first mask including a first pattern and a second pattern; and a second mask including a third pattern, wherein said second pattern includes a first portion and a second portion; in which when the double exposure process is performed, said first portion, which is overlapping with the third pattern, has the width equal to or larger than the resolution limit, and said second portion of the second pattern, which is not overlapping with the third pattern, has the width equal to or smaller than the resolution limit;

said first pattern includes a third portion and a fourth portion in which when a double exposure process is performed, said third portion, which is overlapping with the third pattern, has the width equal to or larger than the resolution limit, and said fourth portion, which is not overlapping with the third pattern, has the width equal to or larger than the resolution limit; and by the double exposure process, said first portion of the second pattern is erased by the third pattern and only the first pattern is transferred.

9. The photomask according to claim 8, wherein the first pattern is a gate pattern to form a gate.

10. The photomask according to claim 8, wherein the first pattern is a gate pattern to form a gate, and the portion having the width equal to or larger than the resolution limit is a gate electrode pattern.

11. The photomask according to claim 8, wherein in the second mask, the third pattern is formed to correspond only to the first pattern.

12. The photomask according to claim 8, wherein the width of the second pattern is adjusted so that the second pattern can be removed with the exposure of the second mask.

13. A manufacturing method of semiconductor device comprising the steps of:

forming a resist layer on a semiconductor substrate;

performing first exposure with a first mask including a first pattern and a second pattern onto said resist layer;

performing second exposure with a second mask including a third pattern onto said resist layer; and after the first and second exposures, forming a resist pattern by performing a development process of said resist layer, wherein said second pattern includes a first portion and a second portion; in which when the double exposure process is performed, said first portion, which is overlapping with the third pattern, has the width equal to or larger than the resolution limit, and said second portion of the second pattern, which is not overlapping with the third pattern, has the width equal to or smaller than the resolution limit; and said first pattern includes a third portion and a fourth portion in which when a double exposure process is performed, said third portion, which is overlapping with the third pattern, has the width equal to or larger than the resolution limit, and said fourth portion, which is not overlapping with the third pattern, has the width equal to or larger than the resolution limit.

14. The manufacturing method of the semiconductor device according to claim 13, wherein by the second exposure, said first portion of the second pattern is erased by the third pattern; and said resist pattern has only a pattern corresponding to the first pattern.

* * * * *